(12) United States Patent
Straeussnigg et al.

(10) Patent No.: US 12,170,874 B2
(45) Date of Patent: Dec. 17, 2024

(54) DIGITAL NON-LINEARITY COMPENSATION IN A SILICON MICROPHONE

(71) Applicant: Infineon Technologies AG, Neubiberg (DE)

(72) Inventors: Dietmar Straeussnigg, Villach (AT); Niccoló De Milleri, Villach (AT); Hong Chen, Villach (AT); Simon Gruenberger, Moosburg (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 468 days.

(21) Appl. No.: 17/675,801

(22) Filed: Feb. 18, 2022

(65) Prior Publication Data
US 2023/0269534 A1 Aug. 24, 2023

(51) Int. Cl.
H04R 3/06 (2006.01)
H03M 1/12 (2006.01)
H04R 3/02 (2006.01)
H04R 19/04 (2006.01)

(52) U.S. Cl.
CPC .............. H04R 3/06 (2013.01); H03M 1/12 (2013.01); H04R 3/02 (2013.01); H04R 19/04 (2013.01); H04R 2201/003 (2013.01)

(58) Field of Classification Search
CPC . H04R 3/06; H04R 3/02; H04R 19/04; H04R 2201/003; H04R 1/08; H04R 3/00; H04R 19/005; H03M 1/12; H03M 3/458; H03M 1/1023; H03M 3/388; H03M 1/1042

USPC .............. 381/111–115, 91, 92, 122; 330/10, 330/207 A, 251
See application file for complete search history.

(56) References Cited

U.S. PATENT DOCUMENTS

| | | | |
|---|---|---|---|
| 6,570,514 B1* | 5/2003 | Velazquez | H03M 1/1052 341/120 |
| 8,718,209 B2 | 5/2014 | Lozhkin | |
| 9,716,933 B2* | 7/2017 | Oliaei | H03G 5/165 |
| 10,594,329 B1 | 3/2020 | Elkholy | |
| 10,848,173 B2* | 11/2020 | Kim | H03M 3/344 |
| 11,463,072 B1* | 10/2022 | Velazquez | H03F 3/24 |
| 2007/0176805 A1* | 8/2007 | Stewart | H03M 3/388 341/118 |
| 2009/0027117 A1* | 1/2009 | Andersen | H03F 3/217 330/10 |
| 2015/0131819 A1* | 5/2015 | Straeussnigg | H04R 1/04 381/173 |
| 2015/0319529 A1* | 11/2015 | Klippel | H04R 3/007 381/55 |
| 2016/0087604 A1* | 3/2016 | Kim | H03H 17/0261 708/304 |
| 2016/0191020 A1* | 6/2016 | Velazquez | H04L 25/02 341/118 |
| 2016/0344358 A1 | 11/2016 | Oliaei | |

(Continued)

*Primary Examiner* — Xu Mei
(74) *Attorney, Agent, or Firm* — Slater Matsil, LLP

(57) ABSTRACT

According to an embodiment, a digital microphone includes an analog-to-digital converter (ADC) for receiving an analog input signal; a DC blocker component coupled to the ADC; a digital low pass filter coupled to the DC block component; and a nonlinear compensation component coupled to the digital low pass filter for providing a digital output signal.

20 Claims, 14 Drawing Sheets

(56) References Cited

U.S. PATENT DOCUMENTS

2020/0162099 A1     5/2020   Perrott
2024/0072831 A1*   2/2024   Morche ................ H03F 1/3247

* cited by examiner

DIGITAL NON-LINEARITY COMPENSATION IN A SILICON MICROPHONE

TECHNICAL FIELD

The present invention relates generally to digital non-linearity compensation in a silicon microphone, and a corresponding system.

BACKGROUND

Generally, silicon microphones (also referred to as "digital microphones") include an analog-to-digital converter (ADC) for converting an analog signal from a micro-electro-mechanical system (MEMS) device into a digital signal. The digital signal also includes noise generated by the ADC, which affects the signal-to-noise ratio (SNR) of the digital microphone. The digital signal also includes nonlinearities caused by both the ADC and the MEMS device, which affects the distortion of the digital microphone.

Market trends regarding digital microphones compel higher SNRs and lower distortion levels. In the design of traditional microphone systems, solutions for improving either of these two specifications are usually inversely correlated. This leads to a trade-off between improving SNR and improving distortion. Thus, improving SNR of the microphone will generally result in increased distortion levels, whereas improving linearity of the microphone will generally result in a lower SNR.

SUMMARY

According to an embodiment, a digital microphone includes an analog-to-digital converter (ADC) for receiving an analog input signal; a DC blocker component coupled to the ADC; a digital low pass filter coupled to the DC block component; and a nonlinear compensation component coupled to the digital low pass filter for providing a digital output signal.

According to an embodiment, a microphone includes a sigma-delta analog-to-digital converter (ADC) for receiving an analog input signal; a DC blocker component coupled to the ADC; a digital low pass filter coupled to the DC block component; and a nonlinear compensation component coupled to the digital low pass filter for providing a linearized digital output signal, wherein the nonlinear compensation component is in at least one feedback loop with a loop filter or an error feedback structure.

According to an embodiment, a method includes converting an analog signal into a first digital signal, wherein the analog signal includes nonlinearities; removing an offset from the first digital signal to provide a second digital signal; low pass filtering the second digital signal to provide a third digital signal; and compensating the third digital signal using a nonlinear transfer function fitted to the nonlinearities in the analog signal to provide a fourth digital signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, an apparatus and method for digital systems such as a digital microphone allows lowering distortion without impacting the SNR of the system. Improvements in the system SNR can thus be made independently from distortion specifications and leads to an overall enhancement of system performance. The non-linearity generated by the system from both the MEMS device and the readout circuit is compensated in the digital signal processing path through a nonlinear compensation component that is described in further detail below. Various embodiments of the nonlinear compensation component are described, including open loop embodiments and closed loop embodiments. For example, in an open loop embodiment, a non-linear correction function, such as a polynomial function can be applied to the digitized output of the MEMS device and readout signal in order to linearize the signal. In closed loop embodiments, linearity correction may be achieved by using a non-linear model of the system in a feedback path of a control loop.

The non-linearity of a system, such as a digital microphone, can be modelled through accurate simulations that model the response of the MEMS device and readout circuit at different input sound wave pressures. Knowing the non-ideality of the transfer function of the digital system, it is possible to apply a correction in the digital domain with a nonlinear compensation component to obtain an output signal with an improved linearity with respect to an uncorrected digital system.

Figure 1:
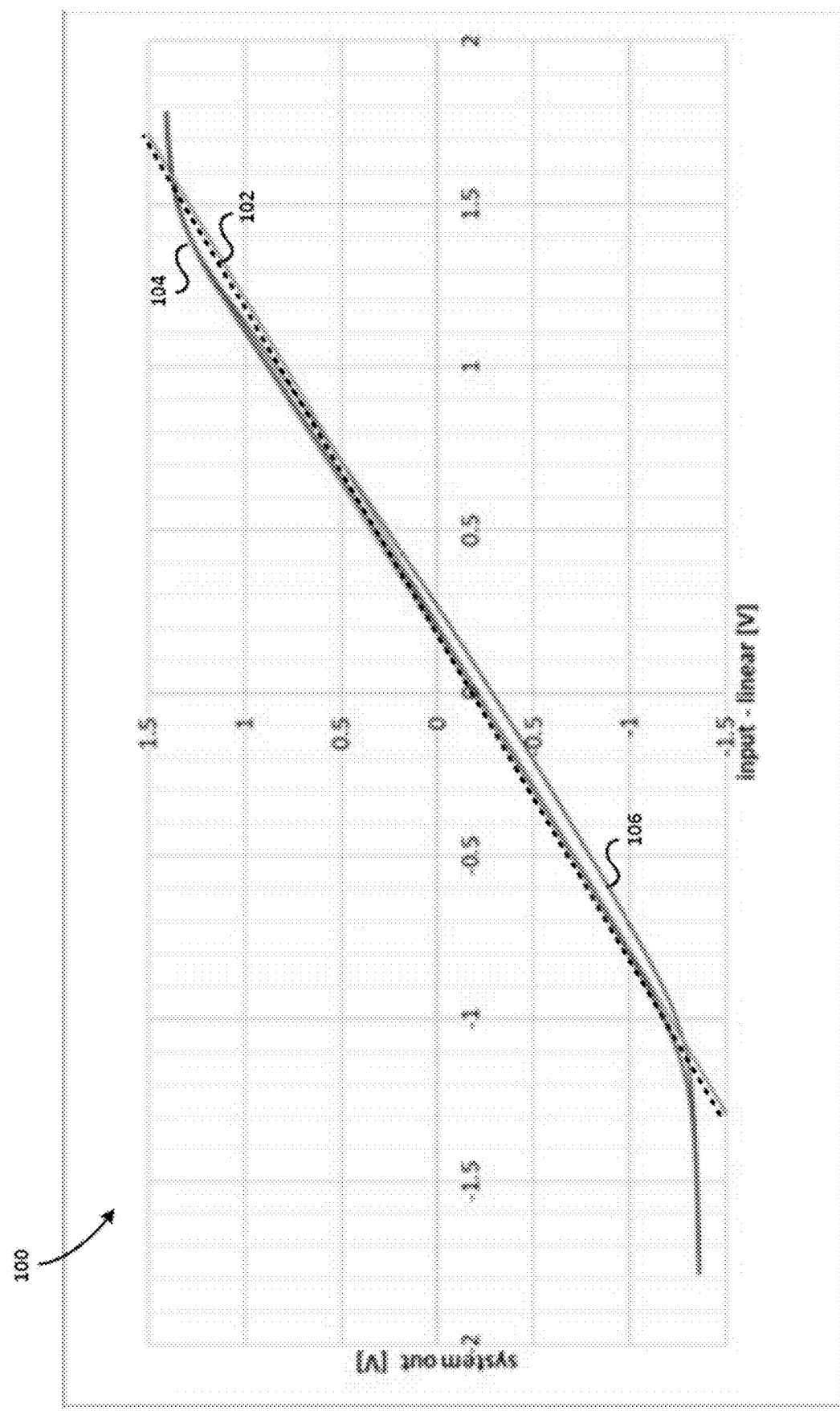
FIG. 1 is an example of an input voltage/output voltage diagram showing the non-linearity of a microphone system compared to ideal linear performance.

For clarity, a generalized digital system transfer function is shown in FIG. 1, wherein an input voltage (VIN) to the digital system is represented on the X-axis, and an output voltage (VOUT) of the digital system is represented on the Y-axis. A straight dotted line 102 represents the ideal linear transfer function, wherein the entire system does not generate any nonlinearities. In an actual digital system, such as a digital microphone, nonlinearities exist that push the transfer function above (trace 104) and/or below (trace 106) the dotted line 102 representing the ideal transfer function. The nonlinearities can be digitally compensated by a nonlinear compensation component, is configured to apply a nonlinear function to an input signal. In an embodiment, the nonlinear function may comprise an open loop fitting polynomial. The transfer function of the polynomial is inversely related to the non-ideal transfer function of the digital system, such that the product of the two transfer functions is linear. Second order and third order polynomials are described below.

For an embodiment nonlinear compensation component, a third order polynomial can be described by the equation: $VOUT = VIN + k1*VIN^2 + k2*VIN^3$, wherein the coefficients $k1$ and $k2$ are determined by measuring the output total harmonic distortion THD0, wherein THD0 is the uncompensated total harmonic distortion THD measured at the output of the digital system. Once the characteristics of THD0 are measured, the coefficients $k1$ and $k2$ can be adjusted such that the transfer function of the digital system is linear and the THD is improved with respect to THD0. In an embodiment, the THD0 measurements and adjustment of the coefficients $k1$ and $k2$ can be performed on a product including the digital system during system test and before the product is shipped to the customer.

For another embodiment nonlinear compensation component, a second order polynomial can be described by the equation: $VOUT = VIN + k1*VIN^2$, wherein the coefficient $k2$ is similarly determined by measuring THD0, wherein THD0 is the uncompensated THD measured at the output of the digital system. Once the characteristics of THD0 are measured, the coefficient $k1$ can be adjusted such that the transfer function of the digital system is linear and the THD is improved with respect to THD0. In an embodiment, the THD0 measurements and adjustment of the coefficient $k1$ can be performed on a product including the digital system during fabrication and before the product is shipped to the customer.

The digital nonlinear compensation component thus associates at each input voltage value a corresponding corrected output tracking the ideal linear desired behavior of the digital system. The digital correction function is obtained with a fitting polynomial that can be second order or third order, and is made as low of an order as possible to in order to reduce system complexity. Higher order polynomials can also be used if desired in some embodiments.

As the non-linearity of the digital system is strongly process dependent it is desirable to adjust or optimize the polynomial to cover the process variations. Different coefficients and different order polynomials can be used for different digital systems. The choice of the proper correction function is performed in a calibration of the digital system, such as a digital microphone, and is based on the measurement of the system THD0 without compensation applied. A very accurate modelling of the system is desired when building the correction functions, as the method relies on the prediction of the distortion introduced by the digital specific system. In embodiments, the measured effect on an existing digital system product can result in a THD reduction on the order of 20 dB.

Figure 2:
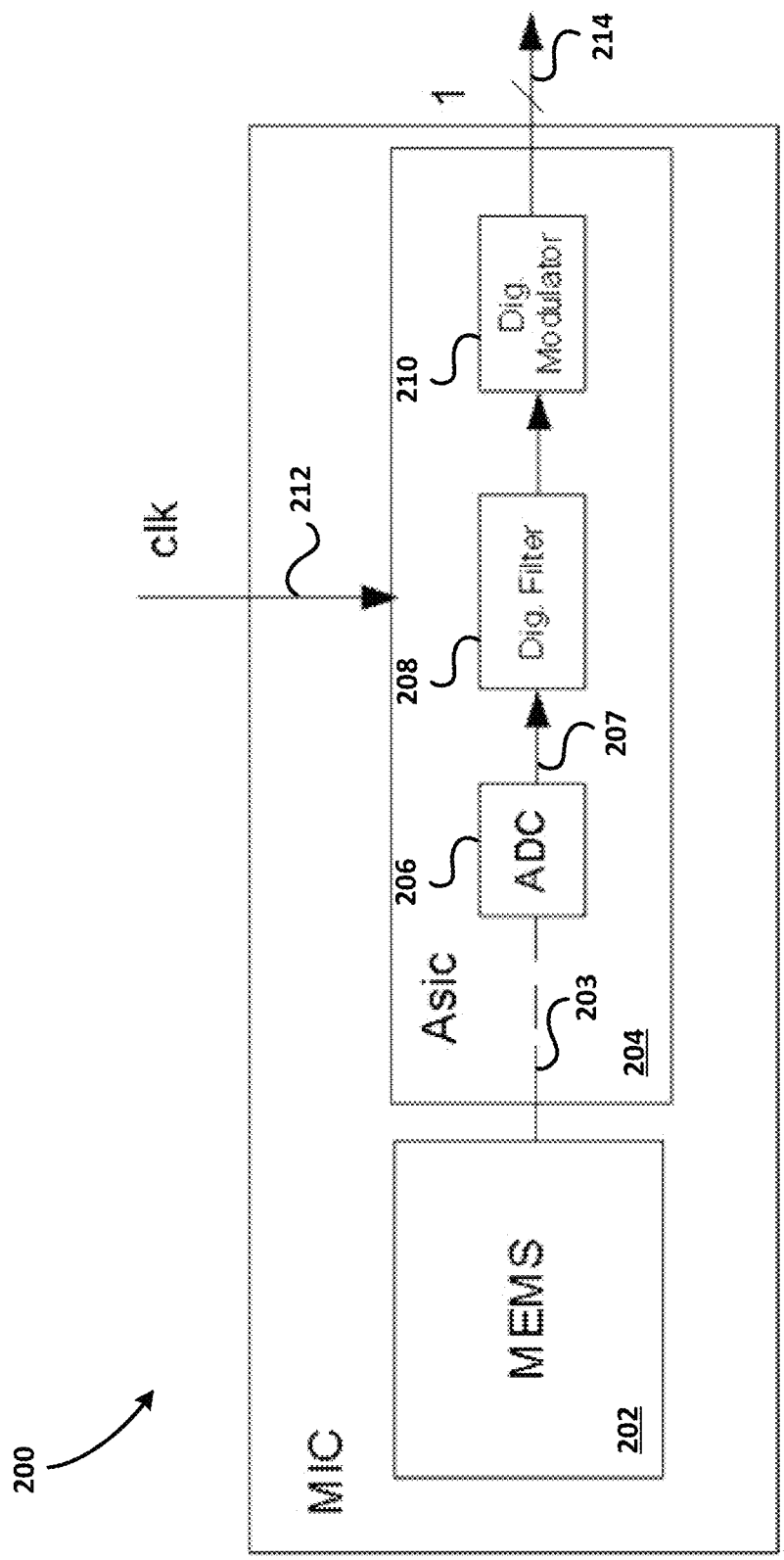
FIG. 2 is a block diagram of an exemplary digital microphone.

FIG. 2 shows a block diagram of an exemplary uncompensated digital microphone 200 including a MEMS device 202, which can be a capacitive MEMS device that generates an analog voltage in response to received sound waves. The analog voltage 203 is received by an Application-Specific Integrated Circuit (ASIC) 204, which includes an ADC 206, a digital filter 208, and a digital modulator 210. The ADC 206 converts the analog voltage into a digital output signal 207, which is then filtered by digital filter 208. ADC 206 can be a sigma-delta ADC or other type of ADC. Digital filter 208 may include an integrator and other filtering circuitry, such as noise-shaping circuitry. The output of digital filter 208 is coupled to digital modulator 210, which converts the digital output signal of digital filter 208 into a one-bit digital signal. The one-bit digital signal is an output signal at one-bit output bus 214.

Figure 3:
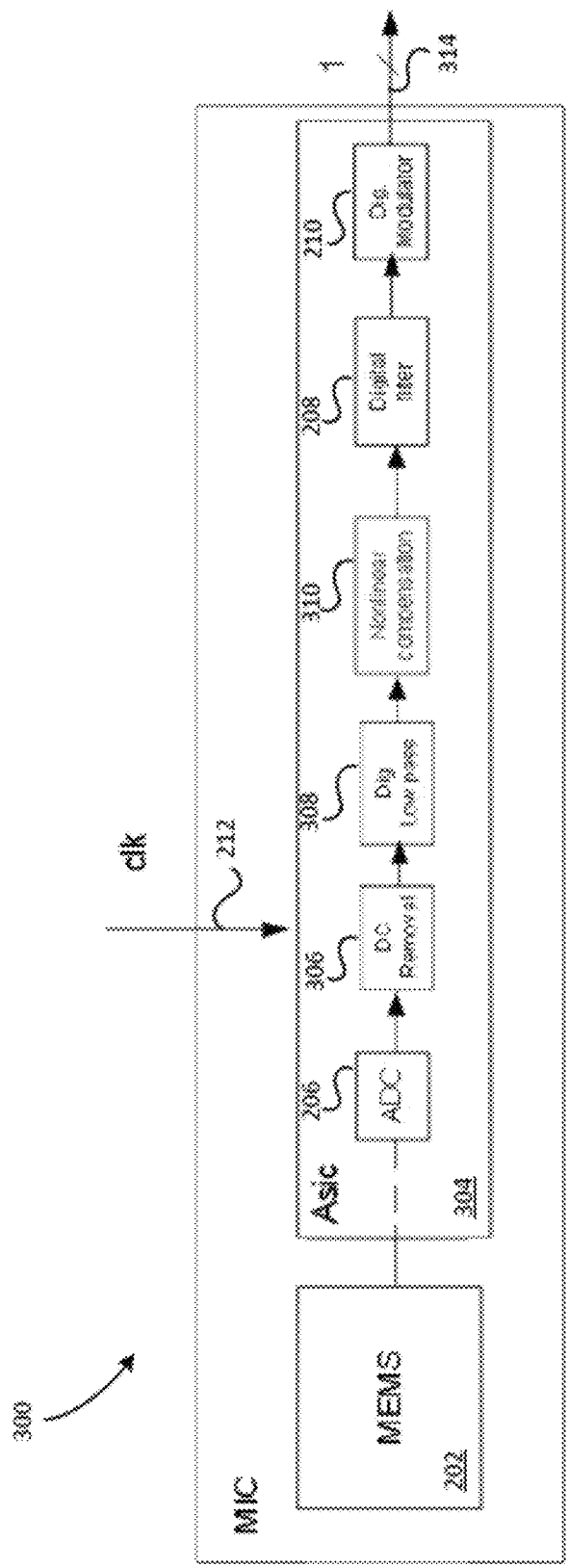
FIG. 3 is a block diagram of a digital microphone including digital nonlinear compensation functionality, according to an embodiment.

FIG. 3 shows a block diagram of a compensated digital microphone 300 including nonlinear digital compensation functionality, according to an embodiment. Digital microphone 300 includes MEMS device 202, ADC 206, digital filter 208, and digital modulator 210, previously shown and described. The output signal at output bus 314 is a digital output signal that is compensated for nonlinearities. The output signal on output bus 314 has lower distortion when compared to the distortion characteristics of exemplary uncompensated digital microphone 200. The nonlinearities are generated by MEMS device 202 and/or the readout circuitry of ASIC 304, which can include ADC 206. In addition, ASIC 304 of compensated digital microphone 300 includes a nonlinear compensation component 310 interposed between ADC 206 and digital filter 208. Nonlinear compensation component 310 can comprise an open loop nonlinear compensation component or a closed loop nonlinear compensation component, both of which are used to compensate system nonlinearities and are described in greater detail below. In addition, digital microphone 300 includes a DC removal component 306 and a digital low pass filter 308 interposed between ADC 206 and nonlinear compensation component 310. In an embodiment, DC removal component 306 can comprise a recursive digital filter. In an embodiment, digital low pass filter 308 can comprise a digital filter having a cutoff frequency adjusted to pass the audio band digital signals generated by ADC 206, but to block the high frequency artifacts that may be generated by ADC 206. In an embodiment, the nonlinear compensation component 310 is located after the DC removal component 306 because the offset (caused by the analog circuitry of ADC 206) is removed in order to obtain an efficient nonlinearity compensation of the digital signals. Similarly, the digital low pass filter 308 is placed before the nonlinear compensation component 310, because of the artifacts generated by the sigma-delta ADC 206 that is used in an embodiment. Applying the sigma-delta ADC output stream directly to the nonlinear compensation component 310 (where the signals are processed with a higher order polynomial in some embodiments), would increase in-band noise due to folding of the ADC high-frequency noise. Advantageously, the digital low pass filter 308, placed before nonlinear compensation component 310, overcomes this issue by reducing the high-frequency noise of ADC 206.

Figure 4:
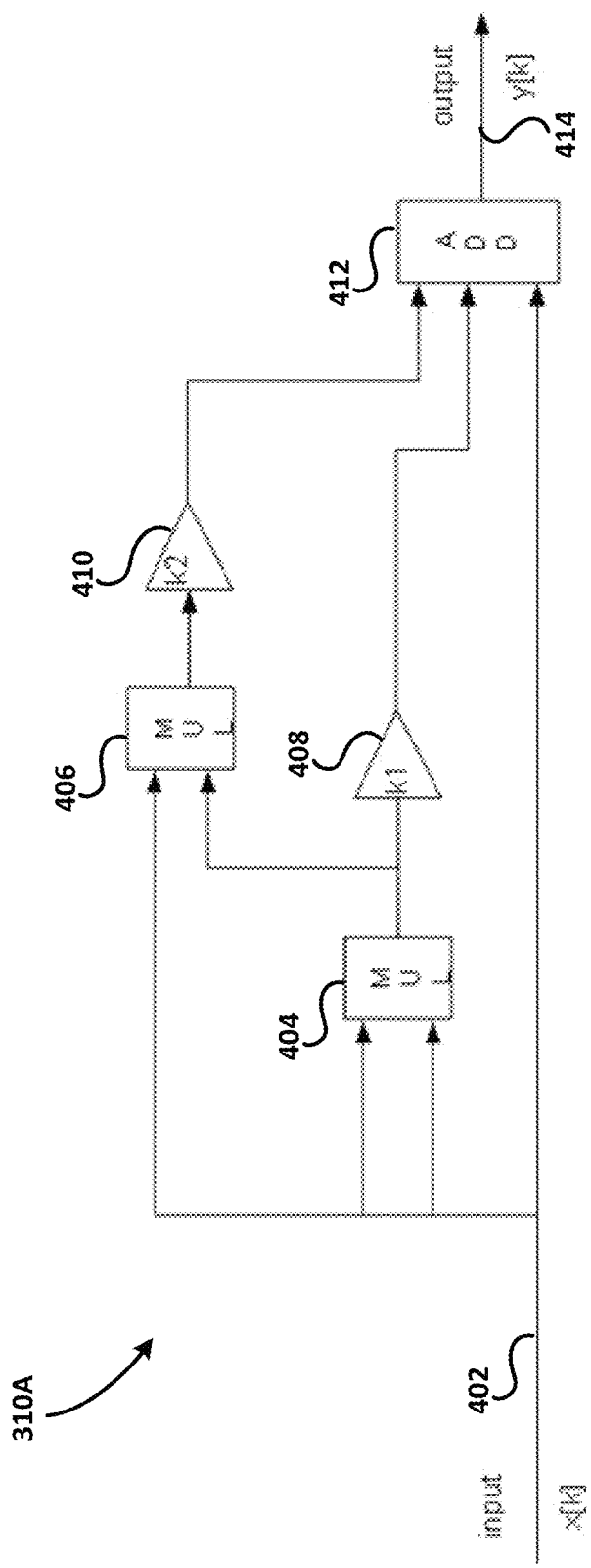
FIG. 4 is a schematic diagram of a nonlinear compensation component shown in the block diagram of FIG. 3.

In FIG. 4 a block diagram of an open loop nonlinear compensation component 310A is depicted. The input x[k] is received at input node 402, and the compensated output y[k] is generated at output node 414. As depicted, nonlinear compensation component 310A implements the third order polynomial transfer function described above. Nonlinear compensation component 310A comprises multipliers 404 and 406, gain stages 408 and 410, and an adder 412. In an embodiment the first and second inputs of multiplier 404 are coupled to input node 402. A first input of multiplier 406 is coupled to input node, and a second input of multiplier 406 is coupled to an output of multiplier 404. Gain stage 408 implements coefficient k1 and has an input coupled to an output of multiplier 404. Gain stage 410 implements coefficient k2 and has an input coupled to an output of multiplier 406. A first input of adder 412 is coupled to an output of gain stage 410, a second input of adder 412 is coupled to an output of gain stage 408, and a third input of adder 412 is coupled to input node 402. The output of adder 412 is coupled to output node 414.

In order to implement a second order transfer function in nonlinear compensation component 310A, multiplier 406, gain stage 410, and one of the inputs of adder 412 can be omitted.

Either a second order polynomial or a third order polynomial is implemented in nonlinear compensation component 310A wherein the coefficients k1 and k2 can be calibrated to improve THD performance of the digital system 300 without any additional performance trade-offs. Specifically, the lower THD allows an improvement of the SNR of the digital system 300 without any impact on distortion. In traditional digital systems, such as digital microphones, the level of the signal delivered by the MEMS device 202 to ASIC 304 (referred to as "MEMS diaphragm compliance") has a direct impact on ASIC SNDR. MEMS diaphragm compliance is limited by the distortion generated by the flexible diaphragm in the MEMS device 202. A MEMS device with higher sensitivity may produce more distortion for a given signal. The sensitivity is highly dependent upon the process used to fabricate the MEMS device 202, and the particular design of the MEMS device 202. In embodiments, digital microphone 300 compensates the non-linear transfer function of the MEMS device 202, and the signal delivered by the MEMS device 202 can therefore be arbitrarily increased. This, in turn, significantly reduces the impact of ASIC noise in the digital system 300. Also, MEMS SNR advantageously benefits from embodiment linearization methods due to the increased compliance ratio between the flexible diaphragm and a stationary stator of the MEMS device 202 that is a factor in the MEMS noise performance.

In summary, an embodiment open loop digital microphone, system, and method implements digital non-linearity compensation, which results in reduced distortion and higher SNR when compared to uncompensated digital microphones and digital systems. While the above open loop embodiments provide significant benefits when compared to uncompensated digital microphones and systems, the open loop embodiment may add group delay and may generate secondary noise effects in some implementations. A closed loop digital compensation method, which addresses these issues, is described in detail below with respect to FIGS. 5, 6, 7, and 8.

In an embodiment, the non-linearity generated by the digital system 300 comprising the MEMS device 202 and the readout circuit (including ADC 206) is compensated in the digital signal processing path by generating the nonlinear compensation signal in a control loop configuration.

Figure 5:
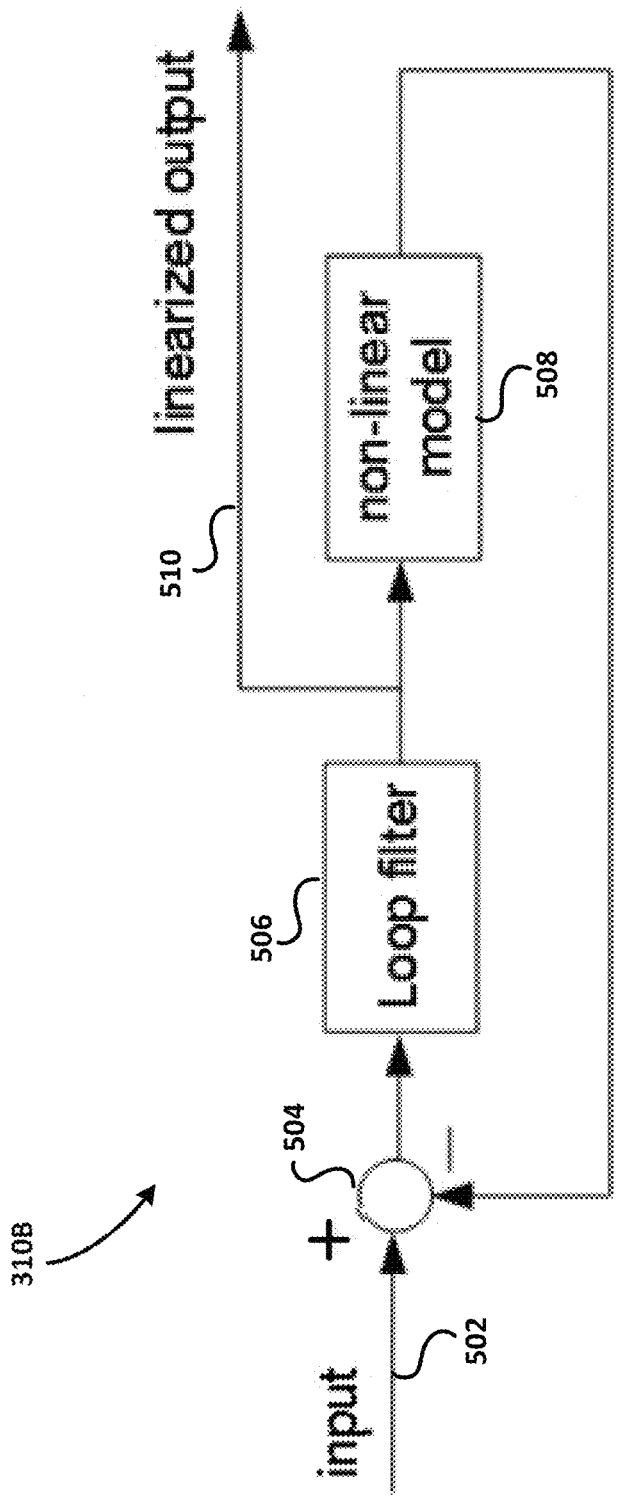
FIG. 5 is a block diagram of a nonlinear compensation component shown in the block diagram of FIG. 3, including a control loop according to an embodiment.

FIG. 5 shows a closed loop digital nonlinear compensation component 310B, according to an embodiment. The digital nonlinear compensation signal is generated in a control loop, which comprises a loop filter 506 and a nonlinear compensation subcomponent 508 (nonlinear model) of the digital system nonlinearity. In an embodiment, loop filter 506 can comprise an integrator, as well as other digital filtering (such as low pass filtering) and signal processing components. The nonlinear compensation subcomponent 508 can comprise a second order or third order polynomial transfer function, or other transfer functions such as a piecewise linear transfer function in order to be fitted to the nonlinearities of the digital system generated by MEMS device 202 and/or ADC 206. The value of the coefficients of the transfer function may assume different values determined during calibration may be different from those determined during calibration of the open loop embodiment shown in FIG. 4.

Closed loop digital nonlinear compensation component 310B also includes a summer 504 having a positive input coupled to the input node 502 for receiving the nonlinear digital signal from ADC 206. The input of loop filter 506 is coupled to the output of summer 504 and provide the digital linearized output signal at output node 510. The nonlinear compensation subcomponent 508 has an input coupled to the output node 510, and an output coupled to a negative input of summer 504. Since summer 504 operates to reduce the signal at the output of the summer in the closed loop embodiment, and since only the summer 504 and the loop filter are interposed between the input node 502 and the output node 510, group delay and secondary noise effects can be reduced when compared with the open loop embodiment of the nonlinear compensation component 310A shown in FIG. 4. By the action of the closed loop, the signals at the positive and negative inputs of summer 504 are substantially the same and have the same nonlinear characteristics. Thus, since the signal at output node 510 is linearized as being generated at the input to the fitted nonlinear model of nonlinear compensation subcomponent 508.

Figure 6:
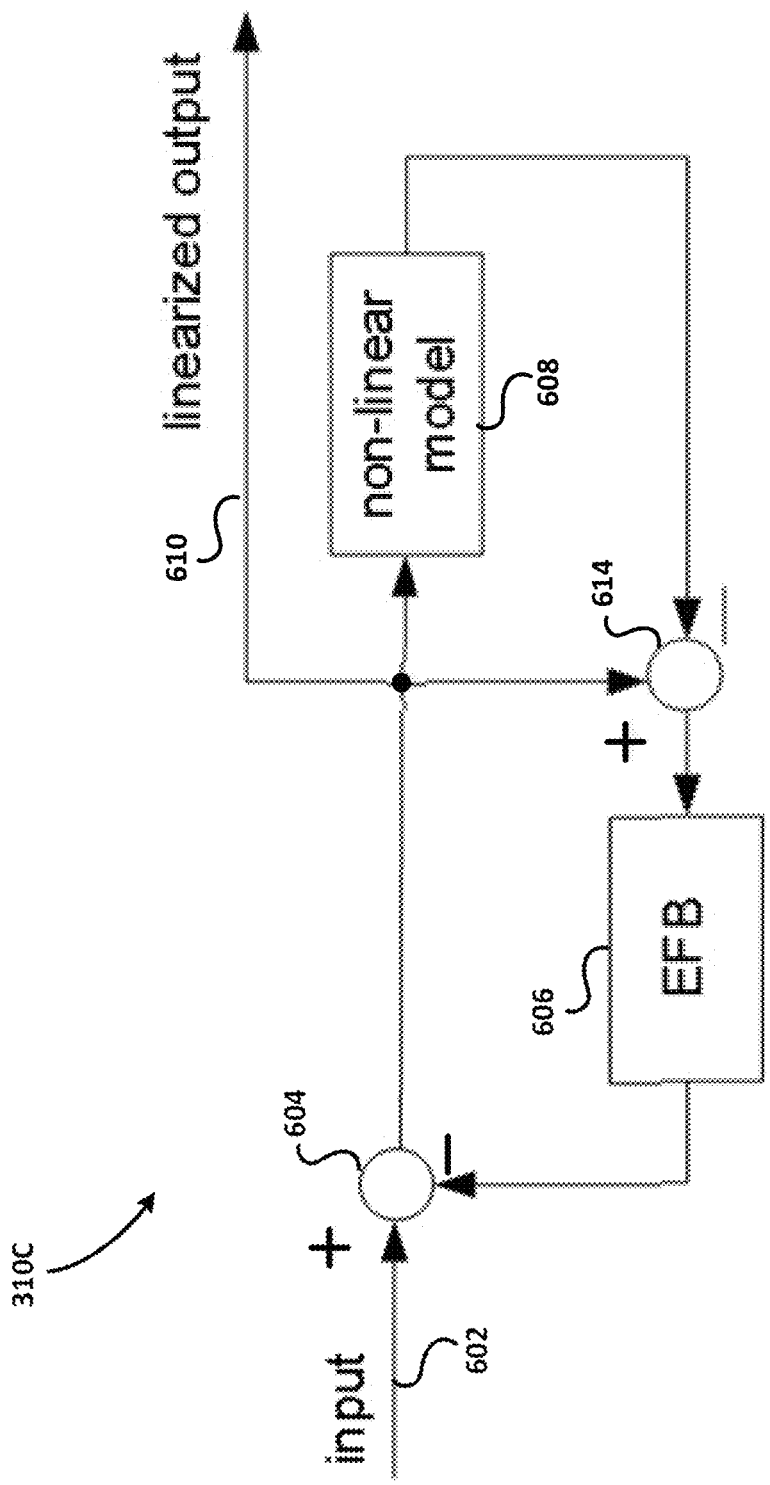
FIG. 6 is a block diagram of a nonlinear compensation component shown in the block diagram of FIG. 3, including a control loop and an error feedback structure according to an embodiment.

In FIG. 6, a block diagram of an alternative embodiment nonlinear compensation component 310C is depicted using an error feedback structure 606. In nonlinear compensation component 310C the nonlinear compensation subcomponent 608 (nonlinear model) receives the linearized output signal as an input and therefore generates fewer harmonics compared to the open loop compensation approach described above.

Nonlinear compensation component 310C comprises a first summer 604, an error feedback structure 606, a nonlinear compensation subcomponent 608, and a second summer 614. The positive input of first summer 604 is coupled to the input node 602 for receiving the filtered output signal from ADC 206. The output of summer is coupled to output node 610, which provides the digital linearized output signal. The nonlinear compensation subcomponent 608 has an input coupled to output node 610, and an output coupled to the negative input of second summer 614. The positive input of second summer is coupled to output node 610. The error feedback structure has an input coupled to the output of second summer 614, and an output coupled to the negative input of first summer 604. The error feedback structure 606 can comprise one or more integrators, as is shown and described below with reference to the embodiments of FIG. 7 and FIG. 8.

Figure 7:
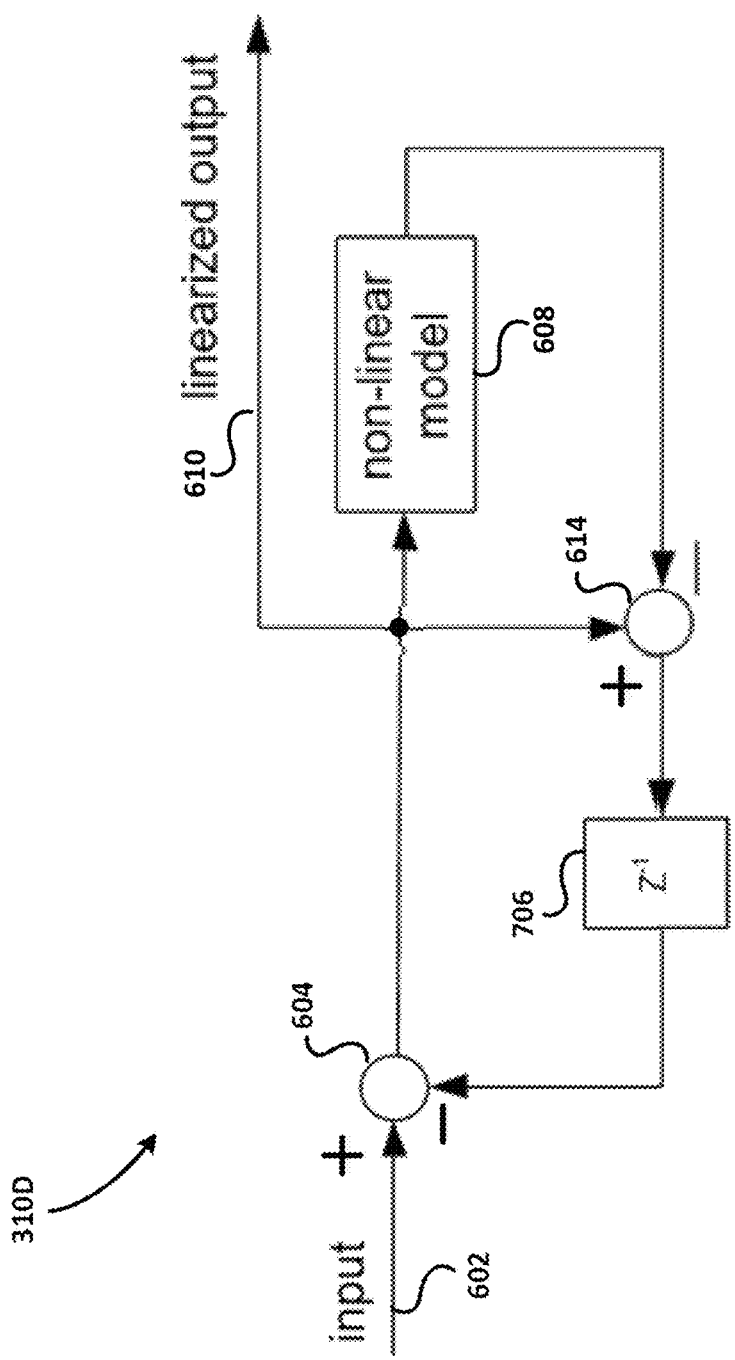
FIG. 7 is a block diagram of the nonlinear compensation component shown in the block diagram of FIG. 6, wherein the error feedback structure comprises an integrator according to an embodiment.
Figure 8:
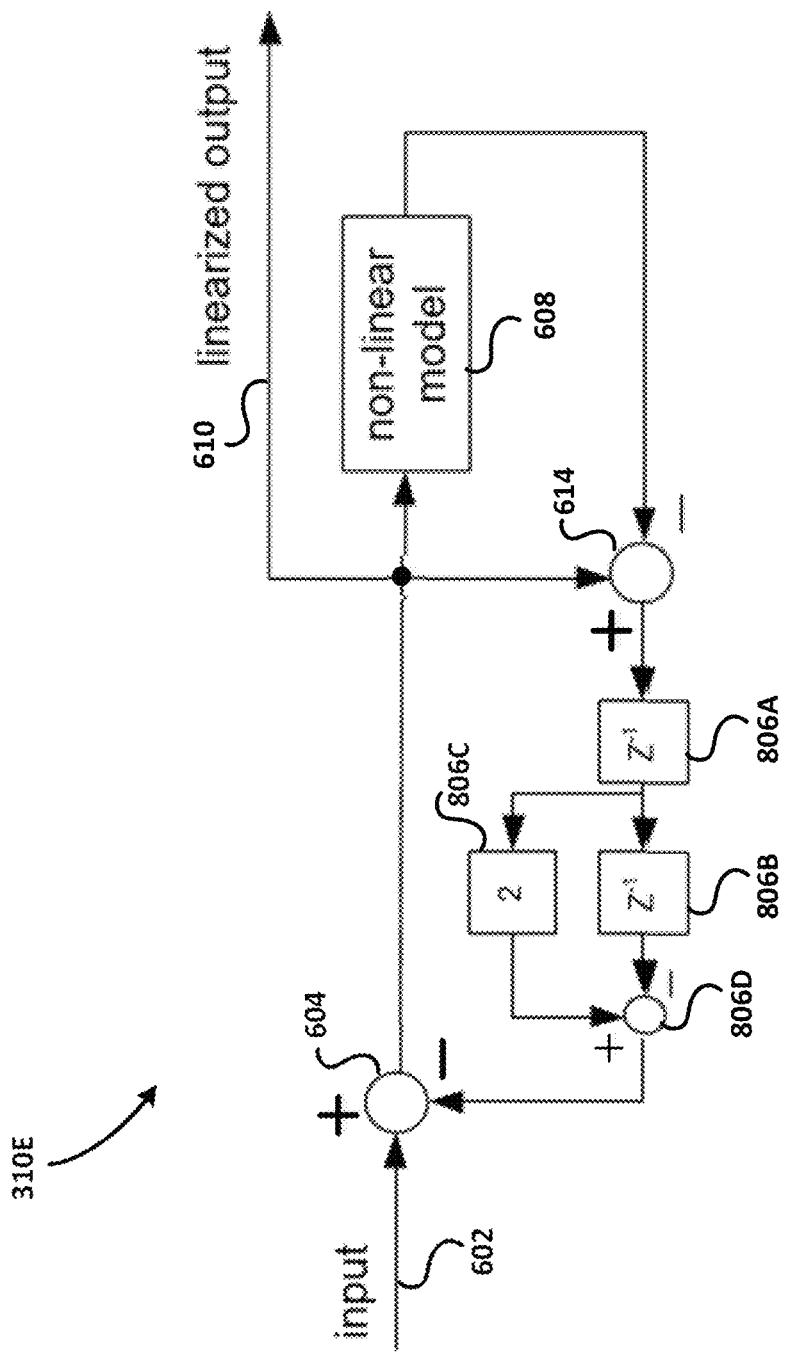
FIG. 8 is a block diagram of the nonlinear compensation component shown in the block diagram of FIG. 6, wherein the error feedback structure comprises serially coupled integrators according to an embodiment.

The block diagram of FIG. 7 shows a nonlinear compensation component 310D comprising a first summer 604, a nonlinear compensation subcomponent 608, and a second summer 614 coupled between input node 602 and output node 610, all previously described. The error feedback structure 606 is shown as an integrator 706, represented by the inverse Z-transform symbol, in an embodiment. The input of integrator 706 is coupled to the output of the second summer 614, and the output of integrator 706 is coupled to the negative input of the first summer 604.

The block diagram of FIG. 7 shows a nonlinear compensation component 310D comprising a first summer 604, a nonlinear compensation subcomponent 608, and a second summer 614 coupled between input node 602 and output node 610, all previously described. The error feedback structure 606 is shown as a first integrator 806A coupled in series with a second integrator 806B, in an embodiment. The input of first integrator 806A is coupled to the output of second summer 614, and the output of first integrator 806A is coupled to the input of second integrator 806B. The output of second integrator 806B is coupled to the negative input of third summer 806D, and the output of third summer 806D is coupled to the negative input of first summer 604. A gain stage 806C, having a gain of two, is coupled between the output of first integrator 806A and the positive input of third summer 806D.

Figure 9:
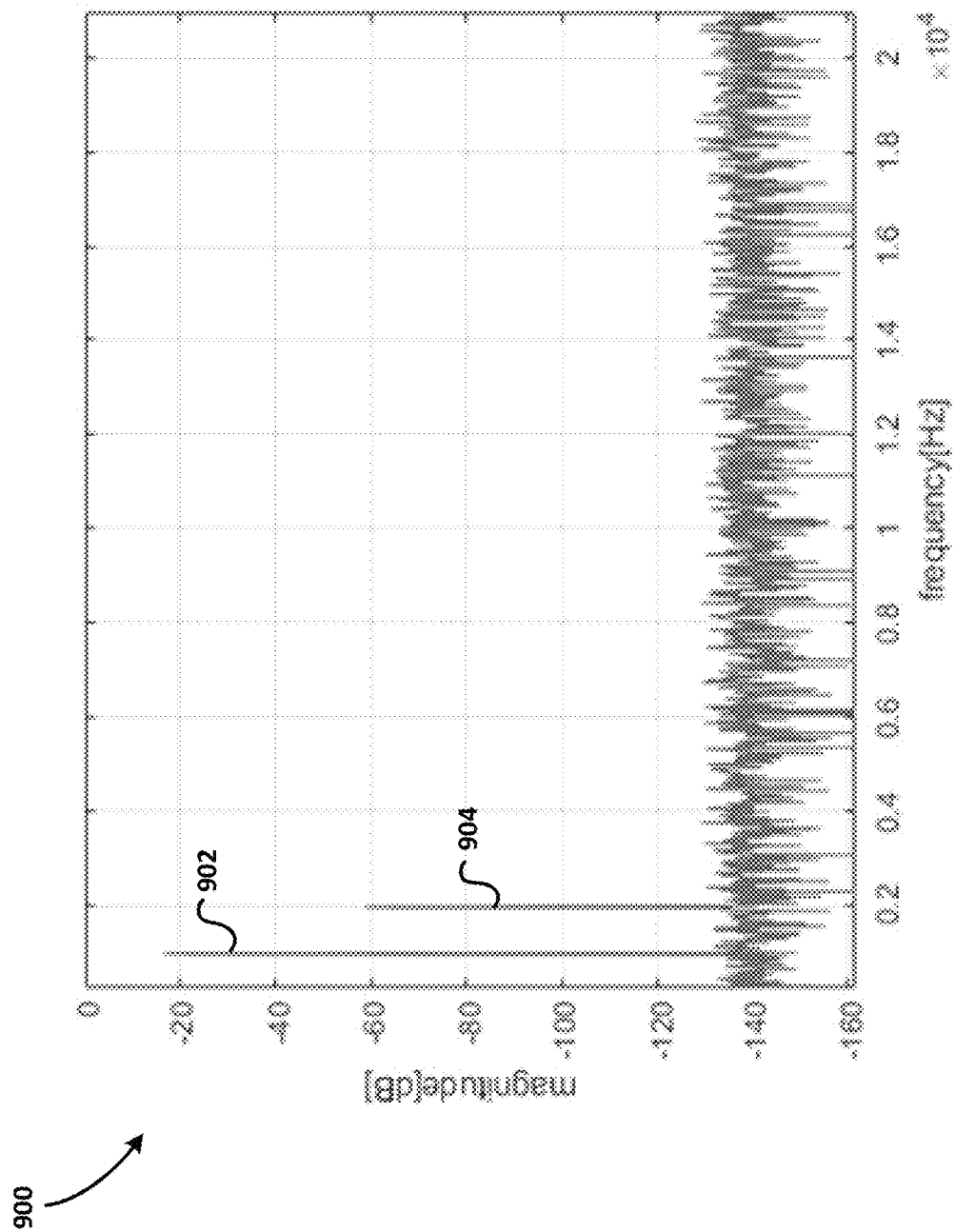
FIG. 9 is a diagram of an FFT of a sigma-delta ADC output showing a strong second order harmonic.

FIG. 9 shows an Fast Fourier Transform (FFT) plot 900 of a sigma-delta ADC output signal magnitude in decibels (dB) versus frequency, showing the fundamental frequency component 902 and a strong second order harmonic frequency component 904.

Figure 10:
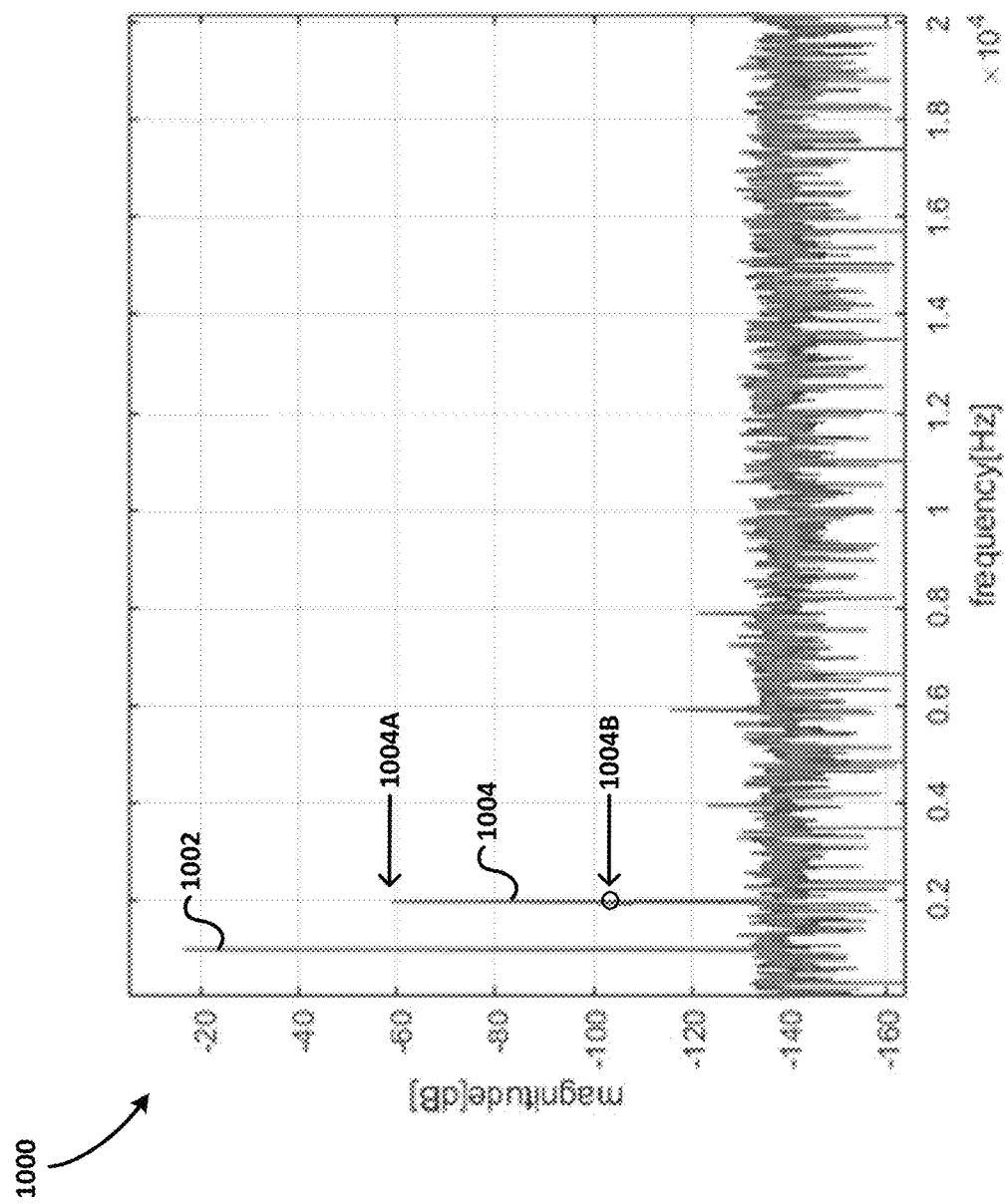
FIG. 10 is a diagram of an FFT comparison between a non-compensated digital microphone and a digital microphone compensated via a control loop according to an embodiment.

FIG. 10 shows an FFT plot 1000 of the linearized output signal in dB versus frequency using the closed loop embodiment shown in, for example, FIG. 5. The impact of the digital nonlinear compensation using a control loop can be seen by the attenuation of the second order harmonic frequency component. In FIG. 10, the fundamental frequency component 1002 is shown, as well as the second order harmonic frequency component 1004. The second order harmonic frequency component is attenuated from the uncompensated value 1004A to the closed loop compensated value 1004B by almost 40 dB. No third order harmonic frequency component is visible in the FFT plot 1000 of FIG. 10.

Figure 11:
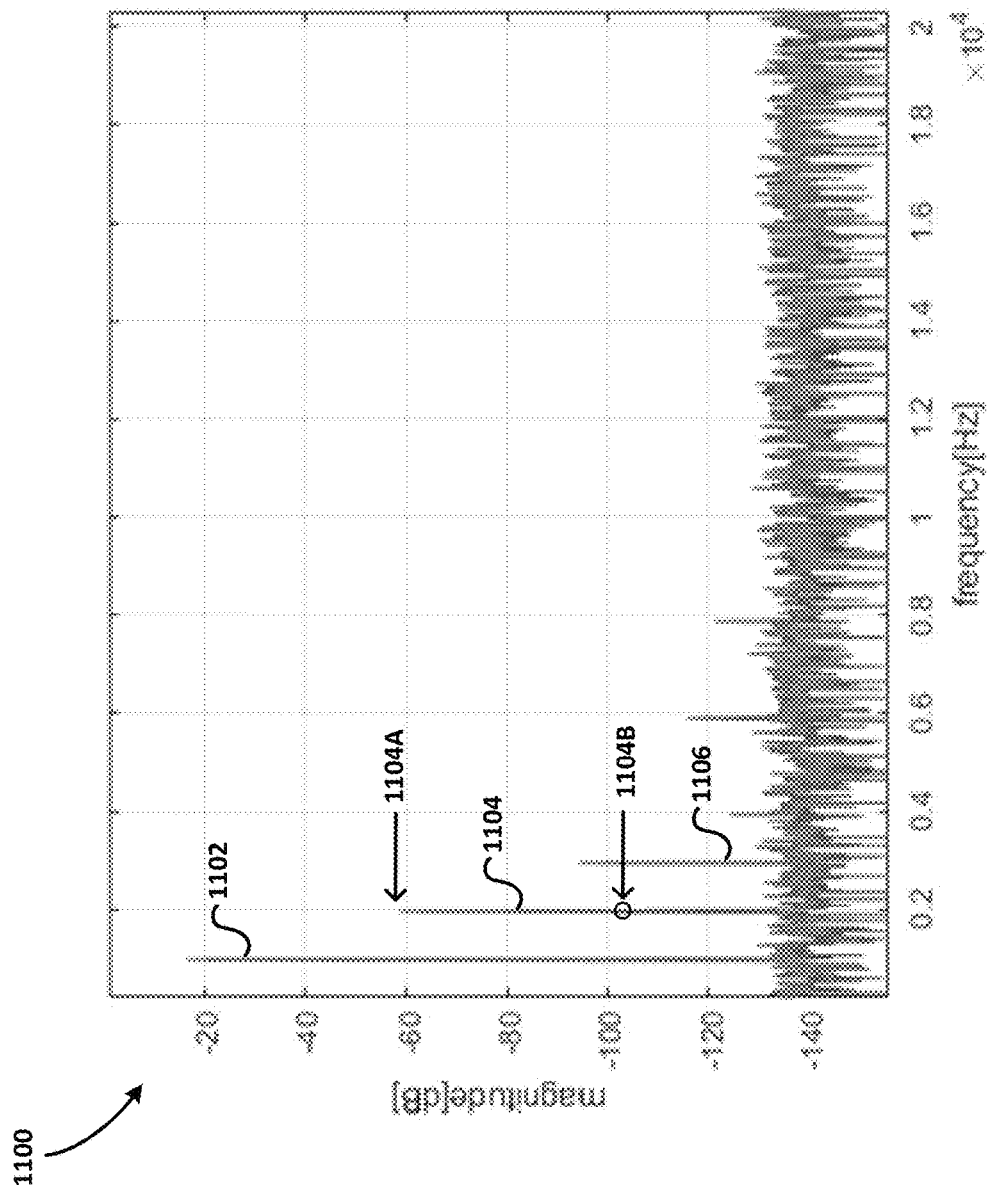
FIG. 11 is a diagram of an FFT comparison between a non-compensated digital microphone and a digital microphone compensated with a polynomial nonlinear compensation component according to an embodiment.

FIG. 11 shown an FFT plot 1100 of the output signal in dB versus frequency using the open loop embodiment using the nonlinear compensation component shown in FIG. 4. FFT plot 1100 shows the fundamental frequency component 1102, a second order frequency component 1104, and a third order frequency component 1106. The second order frequency component 1104 is attenuated from the uncompensated value 1104A to the open loop compensated value 1104B by almost 40 db. While a third order harmonic frequency component is shown in FIG. 11, the total harmonic distortion of the compensated digital system is advantageously still far less than an uncompensated digital system.

Figure 12:
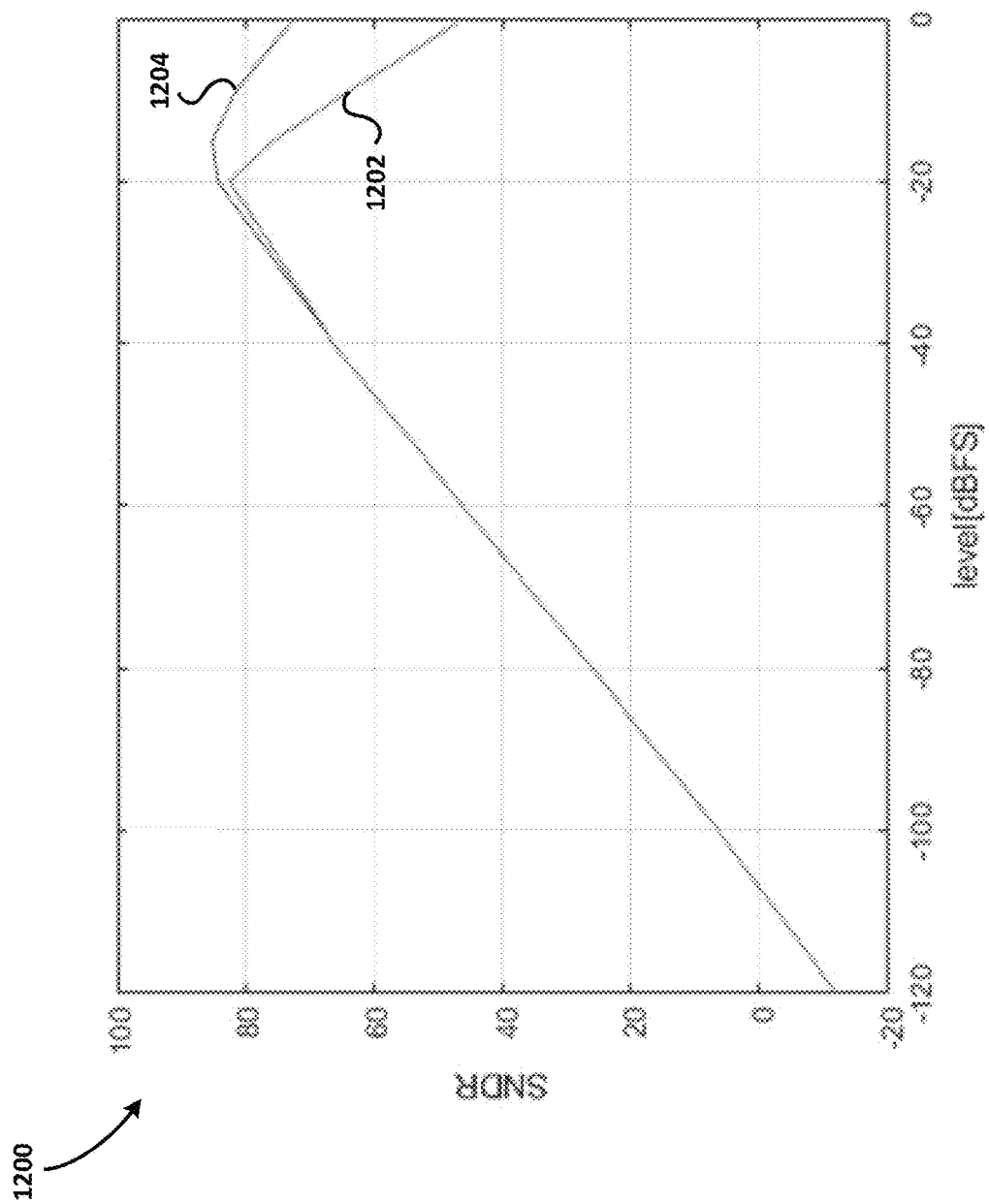
FIG. 12 is a diagram of the signal-to-noise distortion ratio (SNDR) comparison over the input level between a digital microphone compensated with a control loop and a digital microphone compensated with a polynomial nonlinear compensation component according to an embodiment.

Referring now to FIG. 12, a plot 1200 of the signal-to-noise distortion ratio (SNDR) of the open loop compensation method (1202) and the closed loop compensation method (1204) is shown versus decibels with respect to full scale (dBFS) for the same digital system, for example a digital microphone, is shown according to embodiments. Since the closed loop compensation method generates fewer harmonics when compared to the open loop compensation method, performance is somewhat improved from −30 dBFS to zero dBFS. Both compensation methods provide improved linear performance between −120 dBFS and −30 dBFS.

Figure 13:
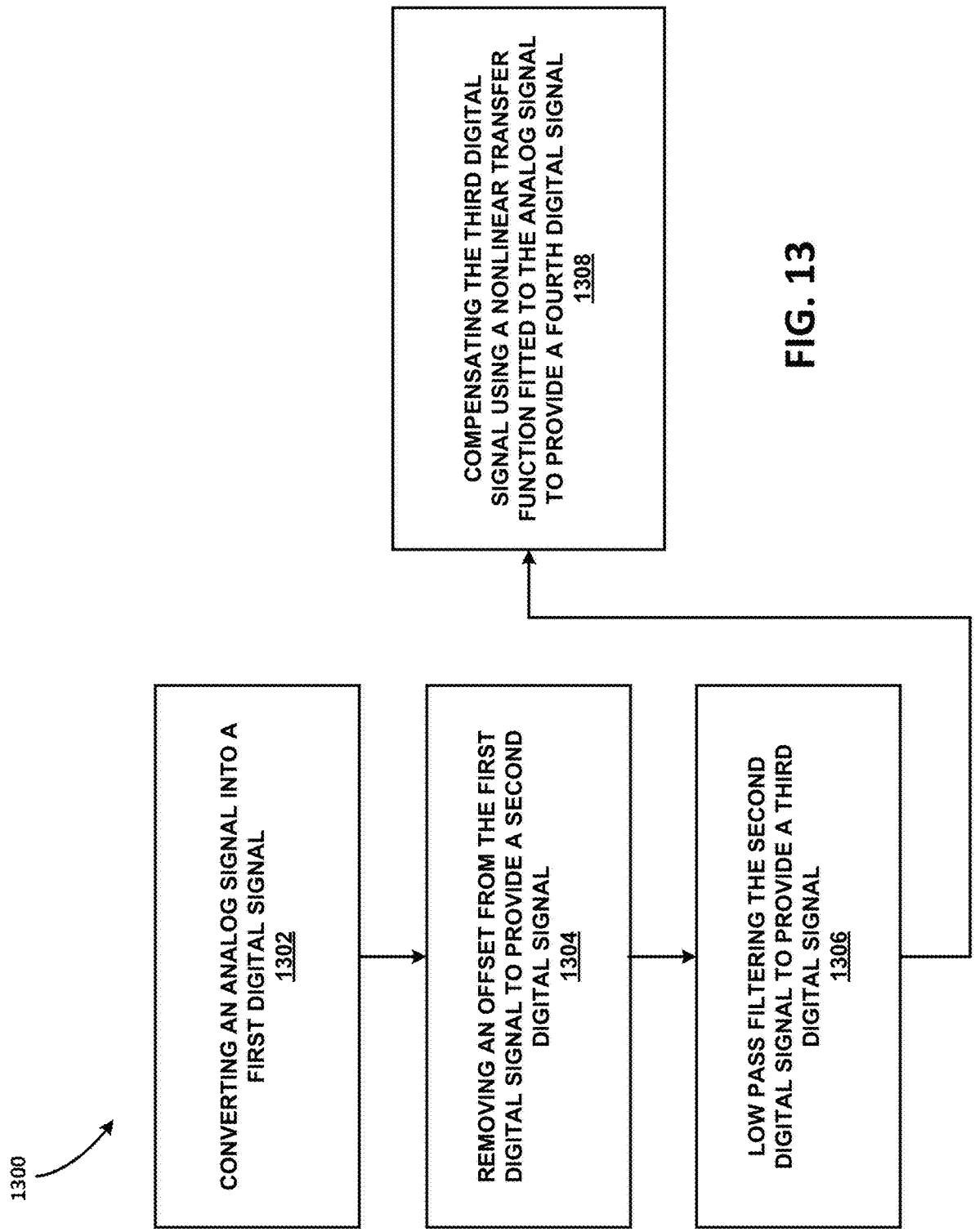
FIG. 13 is a flow chart of a nonlinearity compensation method for a digital microphone according to an embodiment.

A flow chart for a nonlinear compensation method 1300 for a digital microphone is shown in FIG. 13. The method comprises converting an analog signal into a first digital signal, wherein the analog signal includes nonlinearities at step 1302; removing an offset from the first digital signal to provide a second digital signal 1304; low pass filtering the second digital signal to provide a third digital signal 1306; and compensating the third digital signal using a nonlinear transfer function fitted to the nonlinearities in the analog signal to provide a fourth digital signal at step 1308.

Figure 14:
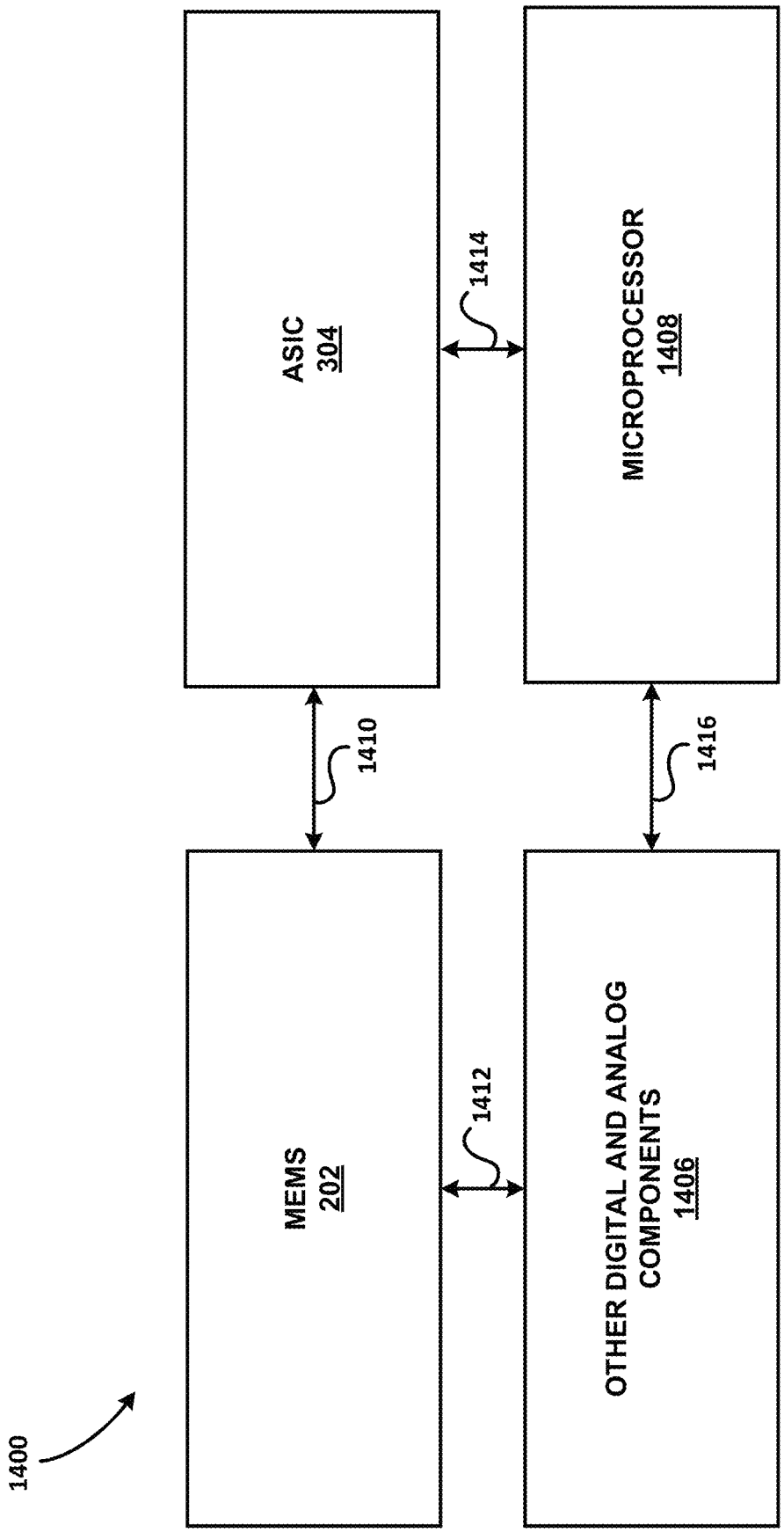
FIG. 14 is a block diagram of a compensated digital microphone system according to an embodiment.

FIG. 14 is a block diagram for a digital system 1400 including a nonlinear compensation component, using either the open loop or closed loop compensation methods and components described above. Digital system 1400 includes MEMS device 202 and ASIC 304, previously described, that are in communication via bidirectional bus 1410. MEMS 202 and ASIC 304 can be packaged together to form a single digital product, such as a digital microphone. In some embodiments, digital system 1400 can also include other digital and analog components 1406, such as additional filters, amplifiers, and other similar components. The other digital and analog components 1406 can communicate with MEMS device through bidirectional bus 1412. In some embodiments, digital system 1400 can also include a microprocessor 1408, which can communicate with ASIC 304 and the other digital and analog components 1406 through bidirectional buss 1414 and bidirectional buss 1416. For example, microprocessor 1408 can generate clock signals and receive data from ASIC 304. In other embodiments, microprocessor 1408 can provide the functionality of digital or software components that would otherwise be resident on ASIC 304.

In some embodiments ASIC 304 can comprise a single integrated circuit, two or more integrated circuits, individual digital and analog components, processors, or a combination thereof. In some embodiments MEMS device 202 can comprise a capacitive MEMS device fabricated out of silicon, and having one or more flexible membranes, and one or more fixed membranes.

Example embodiments of the present invention are summarized here. Other embodiments can also be understood from the entirety of the specification and the claims filed herein.

Example 1. According to an embodiment, a digital microphone includes an analog-to-digital converter (ADC) for receiving an analog input signal; a DC blocker component coupled to the ADC; a digital low pass filter coupled to the DC block component; and a nonlinear compensation component coupled to the digital low pass filter for providing a digital output signal.

Example 2. The digital microphone of Example 1, wherein a transfer function of the nonlinear compensation component includes a second order polynomial.

Example 3. The digital microphone of any of the above examples, wherein the nonlinear compensation component includes a multiplier coupled to an input of the nonlinear compensation component; a gain stage coupled to an output of the multiplier; and an adder coupled to an output of the gain stage and coupled to the input of the nonlinear compensation component.

Example 4. The digital microphone of any of the above examples, wherein a transfer function of the nonlinear compensation component includes a third order polynomial.

Example 5. The digital microphone of any of the above examples, wherein the nonlinear compensation component includes a first multiplier coupled to an input of the nonlinear compensation component; a first gain stage coupled to an output of the first multiplier; a second multiplier coupled to the input of the nonlinear compensation component and coupled to the output of the first multiplier; a second gain stage coupled to an output of the second multiplier; an adder coupled to an output of the first gain stage, coupled to an output of the second gain stage, and coupled to the input of the nonlinear compensation component.

Example 6. The digital microphone of any of the above examples, wherein the nonlinear compensation component includes a summer having a first input coupled to an input of the nonlinear compensation component; a loop filter coupled to an output of the summer, and an output configured for providing a linearized output signal; and a nonlinear compensation subcomponent coupled to an output of the loop filter, and an output coupled to a second input of the summer.

Example 7. The digital microphone of any of the above examples, wherein the nonlinear compensation component includes a first summer having a first input coupled to an input of the nonlinear compensation component, and an output configured for providing a linearized output signal; a second summer having a first input coupled to the output of the first summer; a nonlinear compensation subcomponent coupled to the output of first summer, and an output coupled to a second input of the second summer; and an error feedback structure coupled between an output of the second summer and an input of the first summer.

Example 8. The digital microphone of any of the above examples, wherein the error feedback structure includes an integrator.

Example 9. The digital microphone of any of the above examples, wherein the error feedback structure includes a first integrator in series with a second integrator.

Example 10. The digital microphone of any of the above examples, further includes a third summer having a first input coupled to the second integrator; and a third gain stage coupled between an output of the first integrator and a second input of the third summer.

Example 11. The digital microphone of any of the above examples, further including a microelectromechanical system (MEMS) device coupled to an input of the ADC.

Example 12. The digital microphone of any of the above examples, wherein the MEMS device includes a capacitive MEMS microphone device.

Example 13. The digital microphone of any of the above examples, wherein the ADC includes a sigma-delta ADC.

Example 14. The digital microphone of any of the above examples, wherein the digital microphone is fabricated in an Application Specific Integrated Circuit (ASIC).

Example 15. The digital microphone of any of the above examples, further including another digital filter and a digital modulator interposed between the nonlinear compensation component and an output of the digital microphone.

Example 16. The digital microphone of any of the above examples, wherein the digital modulator includes a single-bit digital modulator.

Example 17. According to an embodiment, a microphone includes a sigma-delta analog-to-digital converter (ADC) for receiving an analog input signal; a DC blocker component coupled to the ADC; a digital low pass filter coupled to the DC block component; and a nonlinear compensation component coupled to the digital low pass filter for providing a linearized digital output signal, wherein the nonlinear compensation component is in at least one feedback loop with a loop filter or an error feedback structure.

Example 18. According to an embodiment, a method includes converting an analog signal into a first digital signal, wherein the analog signal includes nonlinearities; removing an offset from the first digital signal to provide a second digital signal; low pass filtering the second digital signal to provide a third digital signal; and compensating the third digital signal using a nonlinear transfer function fitted to the nonlinearities in the analog signal to provide a fourth digital signal.

Example 19. The method of Example 18, wherein the nonlinear transfer function is in a feedback loop with a loop filter.

Example 20. The method of any of the above examples, wherein the nonlinear transfer function is in a first feedback loop coupled to a second feedback loop, and wherein an error feedback structure is in the second feedback loop.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A digital microphone comprising:
an analog-to-digital converter (ADC) for receiving an analog input signal;
a DC blocker component coupled to the ADC;
a digital low pass filter coupled to the DC blocker component; and
a nonlinear compensation component coupled to the digital low pass filter for providing a digital output signal,
wherein a transfer function of the nonlinear compensation component comprises a second order polynomial, and
wherein the nonlinear compensation component comprises a multiplier coupled to an input of the nonlinear compensation component, a gain stage coupled to an output of the multiplier, and an adder coupled to an output of the gain stage and coupled to the input of the nonlinear compensation component.

2. The digital microphone of claim 1, further comprising a microelectromechanical system (MEMS) device coupled to an input of the ADC.

3. The digital microphone of claim 2, wherein the MEMS device comprises a capacitive MEMS microphone device.

4. The digital microphone of claim 1, wherein the ADC comprises a sigma-delta ADC.

5. The digital microphone of claim 1, wherein the digital microphone is fabricated in an Application Specific Integrated Circuit (ASIC).

6. The digital microphone of claim 1, further comprising another digital filter and a digital modulator interposed between the nonlinear compensation component and an output of the digital microphone.

7. The digital microphone of claim 6, wherein the digital modulator comprises a single-bit digital modulator.

8. A microphone comprising:
a sigma-delta analog-to-digital converter (ADC) for receiving an analog input signal;
a DC blocker component coupled to the ADC;
a digital low pass filter coupled to the DC block component; and
a nonlinear compensation component coupled to the digital low pass filter for providing a linearized digital output signal, wherein the nonlinear compensation component is in at least one feedback loop with a loop filter or an error feedback structure,
wherein a transfer function of the nonlinear compensation component comprises a second order polynomial, and wherein the nonlinear compensation component comprises a multiplier coupled to an input of the nonlinear compensation component, a gain stage coupled to an output of the multiplier, and an adder coupled to an output of the gain stage and coupled to the input of the nonlinear compensation component.

9. A method comprising:
converting an analog signal into a first digital signal, wherein the analog signal includes nonlinearities;
removing an offset from the first digital signal to provide a second digital signal;
low pass filtering the second digital signal to provide a third digital signal; and
compensating the third digital signal using a nonlinear transfer function fitted to the nonlinearities in the analog signal to provide a fourth digital signalusing a nonlinear compensation component,
wherein a transfer function of the nonlinear compensation component comprises a second order polynomial, and wherein the nonlinear compensation component comprises a multiplier coupled to an input of the nonlinear compensation component, a gain stage coupled to an output of the multiplier, and an adder coupled to an output of the gain stage and coupled to the input of the nonlinear compensation component.

10. The method of claim 9, wherein the nonlinear transfer function is in a feedback loop with a loop filter.

11. The method of claim 9, wherein the nonlinear transfer function is in a first feedback loop coupled to a second feedback loop, and wherein an error feedback structure is in the second feedback loop.

12. A digital microphone comprising:
an analog-to-digital converter (ADC) for receiving an analog input signal;
a DC blocker component coupled to the ADC;
a digital low pass filter coupled to the DC blocker component; and
a nonlinear compensation component coupled to the digital low pass filter for providing a digital output signal,
wherein a transfer function of the nonlinear compensation component comprises a third order polynomial, and wherein the nonlinear compensation component comprises a first multiplier coupled to an input of the nonlinear compensation component, a first gain stage coupled to an output of the first multiplier, a second multiplier coupled to the input of the nonlinear compensation component and coupled to the output of the first multiplier, a second gain stage coupled to an output of the second multiplier, an adder coupled to an output of the first gain stage, coupled to an output of the second gain stage, and coupled to the input of the nonlinear compensation component.

13. The digital microphone of claim 12, further comprising a microelectromechanical system (MEMS) device coupled to an input of the ADC.

14. The digital microphone of claim 12, wherein the ADC comprises a sigma- delta ADC.

15. The digital microphone of claim 12, further comprising another digital filter and a digital modulator interposed between the nonlinear compensation component and an output of the digital microphone.

16. The digital microphone of claim 15, wherein the digital modulator comprises a single-bit digital modulator.

17. A digital microphone comprising:
an analog-to-digital converter (ADC) for receiving an analog input signal;
a DC blocker component coupled to the ADC;
a digital low pass filter coupled to the DC block component; and
a nonlinear compensation component coupled to the digital low pass filter for providing a digital output signal,
wherein the nonlinear compensation component comprises a first summer having a first input coupled to an input of the nonlinear compensation component, and an output configured for providing a linearized output signal, a second summer having a first input coupled to the output of the first summer, a nonlinear compensation subcomponent coupled to the output of first summer, and an output coupled to a second input of the second summer, and an error feedback structure coupled between an output of the second summer and an input of the first summer.

18. The digital microphone of claim 17, wherein the error feedback structure comprises an integrator.

19. The digital microphone of claim 17, wherein the error feedback structure comprises a first integrator in series with a second integrator.

20. The digital microphone of claim 19, further comprising:
a third summer having a first input coupled to the second integrator; and
a third gain stage coupled between an output of the first integrator and a second input of the third summer.

* * * * *

UNITED STATES PATENT AND TRADEMARK OFFICE
CERTIFICATE OF CORRECTION

PATENT NO. : 12,170,874 B2  
APPLICATION NO. : 17/675801  
DATED : December 17, 2024  
INVENTOR(S) : Straeussnigg et al.

It is certified that error appears in the above-identified patent and that said Letters Patent is hereby corrected as shown below:

In the Claims

In Column 11, in Claim 8, Line 24, delete "block" and insert -- blocker --.

In Column 11, in Claim 9, Line 48, delete "signalusing" and insert -- signal using --.

In Column 12, in Claim 14, Line 25, delete "sigma- delta" and insert -- sigma-delta --.

In Column 12, in Claim 17, Line 36, delete "block" and insert -- blocker --.

Signed and Sealed this  
Fourth Day of March, 2025

Coke Morgan Stewart  
*Acting Director of the United States Patent and Trademark Office*